United States Patent [19]

Luch

[11] Patent Number: 5,735,966
[45] Date of Patent: Apr. 7, 1998

[54] SUBSTRATE STRUCTURES FOR INTEGRATED SERIES CONNECTED PHOTOVOLTAIC ARRAYS AND PROCESS OF MANUFACTURE OF SUCH ARRAYS

[76] Inventor: Daniel Luch, 17161 Copper Hill Dr., Morgan Hill, Calif. 95037

[21] Appl. No.: 683,061

[22] Filed: Jul. 16, 1996

Related U.S. Application Data

[63] Continuation-in-part of Ser. No. 441,552, May 15, 1995, Pat. No. 5,547,516.

[51] Int. Cl.⁶ .................... H01L 31/05; H01L 31/18
[52] U.S. Cl. .................... 136/244; 437/2; 437/51
[58] Field of Search .................... 136/244; 437/2, 437/51

[56] References Cited

U.S. PATENT DOCUMENTS

| | | | |
|---|---|---|---|
| 3,255,047 | 6/1966 | Escoffery | 136/244 |
| 3,346,419 | 10/1967 | Webb | 136/244 |
| 3,553,030 | 1/1971 | Lebrun | 136/244 |
| 4,019,924 | 4/1977 | Kurth | 136/251 |
| 4,131,755 | 12/1978 | Keeling et al. | 136/244 |
| 4,173,820 | 11/1979 | Mueller et al. | 437/2 |
| 4,219,926 | 9/1980 | Bloch et al. | 29/832 |
| 4,245,386 | 1/1981 | Kausche et al. | 437/2 |
| 4,754,544 | 7/1988 | Hanak | 437/2 |
| 5,021,099 | 6/1991 | Kim et al. | 136/249 |
| 5,185,042 | 2/1993 | Ferguson | 136/244 |
| 5,248,345 | 9/1993 | Sichanugrist et al. | 136/244 |
| 5,296,043 | 3/1994 | Kawakami et al. | 136/244 |
| 5,385,848 | 1/1995 | Grimmer | 437/2 |
| 5,584,940 | 12/1996 | Yoshida | 136/251 |

*Primary Examiner*—Aaron Weisstuch

[57] ABSTRACT

The invention comprises deposition of thin film photovoltaic junctions on metal foil substrates which can be heat treated following deposition in a continuous fashion without deterioration of the metal support structure. In a separate operation, an interconnection substrate structure is produced in a continuous roll-to-roll fashion. The metal foil supported photovoltaic junction is then laminated to the interconnecting substrate structure and conductive connections are deposited to complete the array. In this way the interconnection substrate structure can be uniquely formulated from polymer-based materials since it does not have to endure high temperature exposure. Furthermore, the photovoltaic junction and its metal foil support can be produced in bulk without the need to use the expensive and intricate material removal operations currently taught in the art to achieve series interconnections.

16 Claims, 8 Drawing Sheets

SUBSTRATE STRUCTURES FOR INTEGRATED SERIES CONNECTED PHOTOVOLTAIC ARRAYS AND PROCESS OF MANUFACTURE OF SUCH ARRAYS

This application is a Continuation-in-Part of application Ser. No. 08/441,552, filed May 15, 1995, now U.S. Pat. No. 5,547,516.

BACKGROUND OF THE INVENTION

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the exceptionally high cost of single crystal silicon material and interconnection processing.

A second approach to produce photovoltaic cells is by depositing thin photovoltaic semiconductor films on a supporting substrate. Material requirements are minimized and technologies can be proposed for mass production. The thin film structures can be designed according to doped homojunction technology such as that involving silicon films, or can employ heterojunction approaches such as those using CdTe or chalcopyrite materials.

Despite significant improvements in individual cell conversion efficiencies for both single crystal and thin film approaches, photovoltaic energy collection has been generally restricted to applications having low power requirements. One factor impeding development of bulk power systems is the problem of economically collecting the energy from an extensive collection surface. Photovoltaic cells can be described as high current, low voltage devices. Typically individual cell voltage is less than one volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

It is readily recognized that making effective, durable series connections among multiple small cells can be laborious, difficult and expensive. In order to approach economical mass production of series connected arrays of individual cells, a number of factors must be considered in addition to the type of photovoltaic materials chosen. These include the substrate employed and the process envisioned. Since thin films can be deposited over expansive areas, thin film technologies offer additional opportunities for mass production of interconnected arrays compared to inherently small, discrete single crystal silicon cells. Thus a number of U.S. patents have issued proposing designs and processes to achieve series interconnections among the thin film photovoltaic cells. Many of these technologies comprise deposition of photovoltaic thin films on glass substrates followed by scribing to form smaller area individual cells. Multiple steps then follow to electrically connect the individual cells in series array. Examples of these proposed processes are presented in U.S. Pat. Nos. 4,443,651, 4,724,011, and 4,769, 086 to Swartz, Turner et al. And Tanner et al. respectively. While expanding the opportunities for mass production of interconnected cell arrays compared with single crystal silicon approaches, glass substrates must inherently be processed on an individual batch basis.

More recently, developers have explored depositing wide area films using continuous roll-to-roll processing. This technology generally involves depositing thin films of photovoltaic material onto a continuously moving web. However, a challenge still remains regarding subdividing the expensive films into individual cells followed by interconnecting into a series connected array. For example, U.S. Pat. No. 4,965,655 to Grimmer et. al. and U.S. Pat. No. 4,697, 041 to Okamiwa teach processes requiring expensive laser scribing and interconnections achieved with laser heat staking. In addition, these two references teach a substrate of thin vacuum deposited metal on films of relatively expensive polymers. The electrical resistance of thin vacuum metallized layers significantly limits the active area of the individual interconnected cells.

It has become well known in the art that the efficiencies of certain promising thin film photovoltaic junctions can be substantially increased by high temperature treatments. These treatments involve temperatures at which even the most heat resistant plastics suffer rapid deterioration, thereby requiring either ceramics, glass, or metal substrates to support the thin film junctions. Use of a glass or ceramic substrate generally restricts one to batch processing and handling difficulty. Use of a metal foil as a substrate allows continuous roll-to-roll processing. However, despite the fact that use of a metal foil allows high temperature processing in roll-to-roll fashion, the subsequent interconnection of individual cells effectively in an interconnected array has proven difficult, in part because the metal foil substrate is electrically conducting.

U.S. Pat. No. 4,747,618 to Nath et al. teaches a design and process to achieve interconnected arrays using roll-to-roll processing of a metal web substrate such as stainless steel. The process includes multiple operations of cutting, selective deposition, and riveting. These operations add considerably to the final interconnected array cost.

U.S. Pat. No. 5,385,848 to Grimmer teaches roll-to-roll methods to achieve integrated series connections of adjacent thin film photovoltaic cells supported on an electrically conductive metal substrate. The process includes mechanical or chemical etch removal of a portion of the photovoltaic semiconductor and transparent top electrode to expose a portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and did collection and disposal, and possible cell contamination. This is not only wasteful but considerably adds to expense. Secondly, the removal processes are difficult to control dimensionally. Thus a significant amount of the valuable photovoltaic semiconductor is lost to the removal process. Ultimate module efficiencies are further compromised in that the spacing between adjacent cells grows, thereby reducing the effective active collector area for a given module area.

Thus there remains a need for an inexpensive manufacturing process which allows high heat treatment for thin film photovoltaic junctions while also offering unique means to achieve effective integrated series connections.

In a somewhat removed segment of technology, a number of electrically conductive fillers have been used to produce electrically conductive polymeric materials. This technology generally involves mixing of the conductive filler into the polymer resin prior to fabrication of the material into its final shape. Conductive fillers typically consist of high aspect ratio particles such as metal fibers, metal flakes, or highly structured carbon blacks, with the choice based on a number of cost/performance considerations.

Electrically conductive resins have been used as bulk thermoplastic compositions, or formulated into paints. Their development has been spurred in large part by electromagnetic radiation shielding and static discharge requirements for plastic components used in the electronics industry. Other known applications include resistive heating fibers and battery components.

In yet another separate technological segment, electroplating on plastic substrates has been employed to achieve decorative effects on items such as knobs, cosmetic closures, faucets, and automotive trim. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction. This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully molded parts and designs. In addition, the many steps employing harsh chemicals make the process intrinsically costly and environmentally difficult. Finally, the sensitivity of ABS plastic to liquid hydrocarbons has prevented certain applications. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special chemical techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated.

Another approach proposed to simplify electroplating of plastic substrates is incorporation of electrically conductive fillers into the resin to produce an electrically conductive plastic. The electrically conductive resin is then electroplated. Examples of this approach are the teachings of Adelman in U.S. Pat. No. 4,038,042 and Luch in U.S. Pat. No. 3,865,699. Adelman taught incorporation of conductive carbon black into a polymeric matrix to achieve electrical conductivity required for electroplating. The substrate was pre-etched to achieve adhesion of the subsequently electrodeposited metal. Luch taught incorporation of small amounts of sulfur into polymer-based compounds filled with conductive carbon black. The sulfur was shown to have two advantages. First, it participated in formation of a chemical bond between the polymer-based substrate and an initial Group VIII based metal electrodeposit. Second, the sulfur increased lateral growth of the Group VIII based metal electrodeposit over the surface of the substrate.

Since the polymer-based compositions taught by Luch could be electroplated directly without any pretreatments, they could be accurately defined as directly electroplateable resins (DER). Directly electroplateable resins, (DER), are characterized by the following features.

(a) having a polymer matrix;

(b) presence of carbon black in amounts sufficient for the overall composition to have an electrical volume resistivity of less than 1000 ohm-cm., e.g., 100 ohm-cm., 10 ohm-cm., 1 ohm-cm.;

(c) presence of sulfur (including any sulfur provided by sulfur donors) in amounts greater than about 0.1% by weight of the overall polymer-carbon-sulfur composition; and (d) presence of the polymer, carbon and sulfur in said directly electroplateable composition of matter in cooperative amounts required to achieve direct, uniform, rapid and adherent coverage of said composition of matter with an electrodeposited Group VIII metal or Group VIII metal-based alloy.

The minimum workable level of carbon black required to achieve electrical resistivities less than 1000 ohm-cm. appears to be about 8 weight percent based on the weight of polymer plus carbon black.

Polymers such as polyvinyls, polyolefins, polystyrenes, elastomers, polyamides, and polyesters are suitable for a DER matrix, the choice generally being dictated by the physical properties required.

In order to eliminate ambiguity in terminology of the present specification and claims, the following definitions are supplied.

"Metal-based" refers to a material having metallic properties comprising one or more elements, at least one of which is an elemental metal.

"Metal-based alloy" refers to a substance having metallic properties and being composed of two or more elements of which at least one is an elemental metal.

"Polymer-based" refers to a substance composed, by volume, of 50 percent or more hydrocarbon polymer.

"Group VIII-based" refers to a metal (including alloys) containing, by weight, 50% to 100% metal from Group VIII of the Periodic Table of Elements.

It is important to note that electrical conductivity alone is insufficient to permit a plastic substrate to be directly electroplated. The plastic surface must be electrically conductive on a microscopic scale. For example, simply loading a small volume percentage of metal fibers may impart conductivity on a scale suitable for electromagnetic radiation shielding, but the fiber separation would likely prevent uniform direct electroplating. In addition, many conductive thermoplastic materials form a non-conductive surface skin during fabrication, effectively eliminating the surface conductivity required for direct electroplating.

OBJECTS OF THE INVENTION

An object of the invention is to eliminate the deficiencies in the prior art methods of producing expansive area, series interconnected photovoltaic arrays. A further object of the present invention is to provide improved substrates to achieve series interconnections among expansive thin film cells. A further object of the invention is to permit inexpensive production of high efficiency, heat treated thin film photovoltaic cells while simultaneously permitting the use of polymer based substrate materials and associated processing to effectively interconnect those cells. A further object of the present invention is to provide improved processes whereby expansive area, series interconnected photovoltaic arrays can be economically mass produced.

Other objects and advantages will become apparent in light of the following description taken in conjunction with the drawings and embodiments.

SUMMARY OF THE INVENTION

The current invention provides a solution to the stated need by producing the active photovoltaic film and interconnecting substrate separately and subsequently combining them to produce the desired expansive series interconnected array. The invention contemplates deposition of thin film photovoltaic junctions on metal foil substrates which can be heat treated following deposition in a continuous fashion without deterioration of the metal support structure. In a separate operation, an interconnection substrate structure is produced in a continuous roll-to-roll fashion. The metal foil supported photovoltaic junction is then laminated to the interconnecting substrate structure and conductive connections are deposited to complete the array. In this way the interconnection substrate structure can be uniquely formulated from polymer-based materials since it does not have to endure high temperature exposure. Furthermore, the photovoltaic junction and its metal foil support can be produced in bulk without the need to use the expensive and intricate material removal operations currently taught in the ad to achieve series interconnections.

BRIEF DESCRIPTION OF THE DRAWINGS

The various factors and details of the structures and manufacturing methods of the present invention are hereinafter more fully set forth with reference to the accompanying drawings wherein:

FIG. 13a is a side view of the process. FIG. 13b is a sectional view taken substantially along line 13b—13b of FIG. 13a.

DESCRIPTION OF PREFERRED EMBODIMENTS

Figure 1:
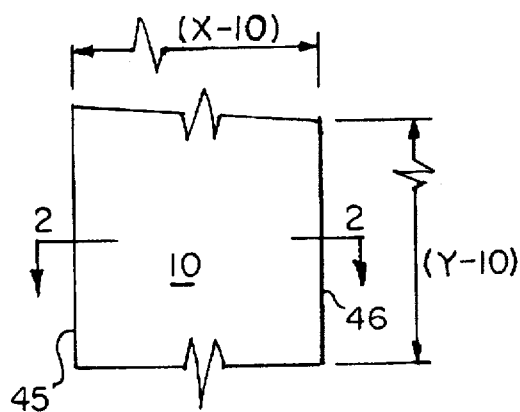
FIG. 1 is a top plan view of a thin film photovoltaic cell deposited on a support foil.

Reference will now be made in detail to the preferred embodiments of the invention, examples of which are illustrated in the accompanying drawings. In the drawings, like reference numerals designate identical or corresponding pads throughout several views and an additional letter designation is characteristic of a particular embodiment.

Figure 2:
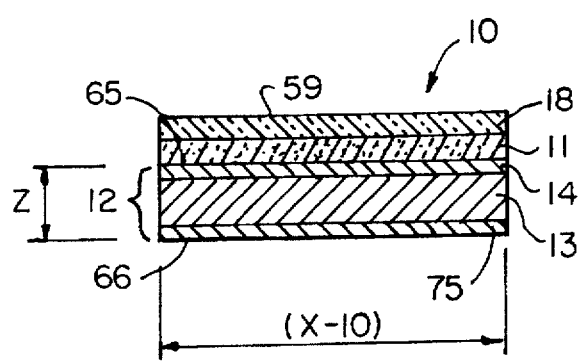
FIG. 2 is a sectional view taken substantially along the line 2—2 of FIG. 1.

Referring to FIG. 1, a thin film photovoltaic cell, supported on a metal-based foil is generally indicated by 10. Structure 10 has a width X-10 and length Y-10. Width X-10 defines a first photovoltaic cell terminal edge 45 and second photovoltaic cell terminal edge 46. It is contemplated that length Y-10 is considerably greater than width X-10 and length Y-10 can generally be described as "continuous" or being able to be processed in a roll-to-roll fashion. FIG. 2 shows that structure 10 comprises a thin film photovoltaic structure 11 supported by metal-based foil 12. Foil 12 has first surface 65, second surface 66, and thickness "Z". Metal-based foil 12 may be of uniform composition or may comprise a laminate of two or more metal-based layers. For example, foil 12 may comprise a base layer of inexpensive and processable metal 13 with an additional metal-based layer 14 disposed between base layer 13 and photovoltaic structure 11. The additional metal-based layer may be chosen to ensure good ohmic contact between the top surface 65 of support 12 and photovoltaic structure 11. Bottom surface 66 of foil support 12 may comprise a material 75 chosen to achieve good electrical and mechanical joining characteristics to the substrate as will be shown. The thickness Z of support layer 12 is generally contemplated to be between 0.001 cm. and 0.025 cm. This thickness would provide adequate handling strength while still allowing flexibility for roll-to-roll processing.

Figure 3:
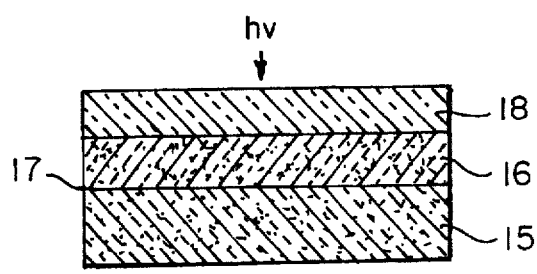
FIG. 3 is an expanded sectional view showing a form of the structure of layer of FIG. 2.

Photovoltaic structure 11 can be any of the thin film structures known in the art. In its simplest form, the photovoltaic cell combines an n-type semiconductor with a p-type semiconductor to form an n-p junction. Most often an optically transparent window electrode such as a thin film of zinc or tin oxide is employed to minimize resistive losses involved in current collection. FIG. 3 illustrates an example of a typical photovoltaic cell structure in section. In FIG. 3, 15 represents a thin film of a p-type semiconductor, 16 a thin film of n-type semiconductor and 17 the resulting photovoltaic junction. Window electrode 18 completes the typical photovoltaic structure. The exact nature of the photovoltaic structure 11 does not form the subject matter of the present invention.

Figure 4:
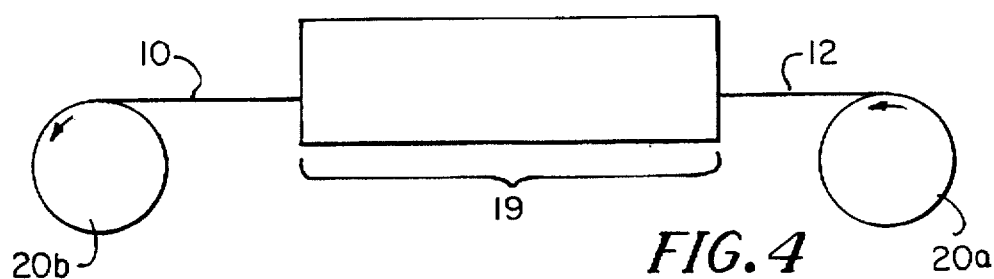
FIG. 4 illustrates a process for producing the structure shown in FIGS. 1 through 3.

FIG. 4 refers to the method of manufacture of the foil supported photovoltaic structures generally illustrated in FIGS. 1 through 3. The metal-based support foil 12 is moved in the direction of its length Y through a deposition process, generally indicated as 19. Process 19 accomplishes deposition of the active photovoltaic structure onto support foil 12. Support foil 12 is unwound from supply roll 20a, passed through deposition process 19 and rewound onto takeup roll 20b. Process 19 can comprise any of the processes well-known in the and for depositing thin film photovoltaic structures. These processes include electroplating, vacuum sputtering, and chemical deposition. Process 19 may also include treatments, such as heat treatments, intended to enhance photovoltaic cell performance.

Figure 5:
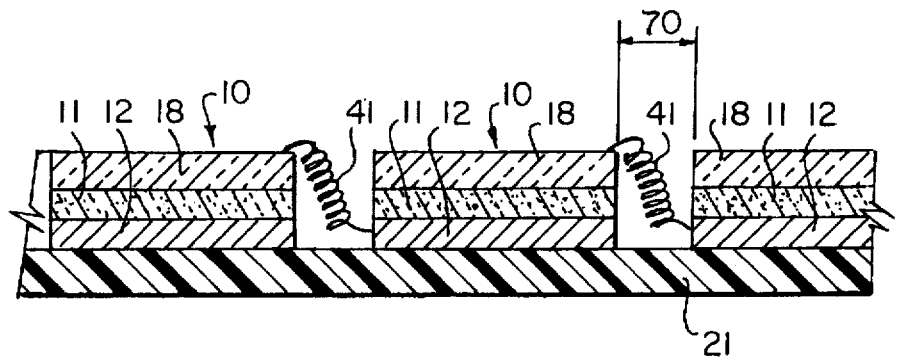
FIG. 5 is a sectional view illustrating the problems associated with making series connections among thin film photovoltaic cells shown in FIGS. 1-3.

Referring now to FIG. 5, there are illustrated cells 10 as shown in FIG. 2. The cells have been positioned to achieve spacial positioning on the support substrate 21. Support structure 21 is by necessity non-conductive at least in that distance indicated by numeral 70 separating the adjacent cells 10. This insulating space prevents shod circuiting from metal foil electrode 12 of one cell to foil electrode 12 of an adjacent cell. In order to achieve series connection, electrical communication must be made from the top surface of window electrode 18 to the foil electrode 12 of an adjacent cell. This communication is shown in the FIG. 5 as a metal wire 41. Metal wire 41 is clearly impractical for inexpensive continuous production and is shown for illustration purposes only.

It should be noted that foil electrode 12 is relatively thin, on the order of 0.001 cm to 0.025 cm. Therefore connecting to its edge as indicated in FIG. 5 would be impractical.

Figure 6:
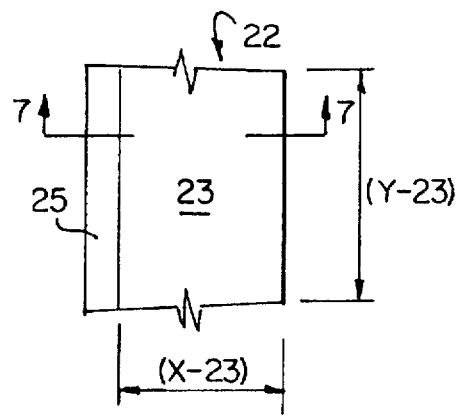
FIG. 6 is a top plan view of a substrate structure for achieving series interconnections of thin film photovoltaic cells.
Figure 7:
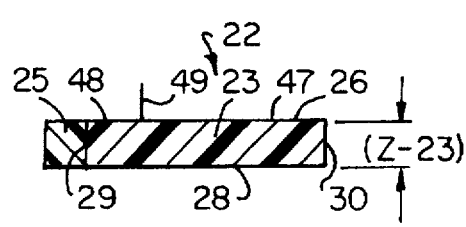
FIG. 7 is a sectional view taken substantially along the line 7—7 of FIG. 6.

Referring now to FIGS. 6 and 7, one embodiment of the substrate structures of the current invention is generally indicated by 22. Unit of substrate 22 comprises electrically conductive sheet 23 and electrically insulating joining portion 25. 25. Electrically conductive sheet 23 has a top surface 26, bottom surface 28, width X-23, length Y-23 and thickness Z-23. Width X-23 defines a first terminal edge 29 and a second terminal edge 30 of conductive sheet 23. Top surface 26 of conductive sheet 23 can be thought of as having top collector surface 47 and top contact surface 48 separated by imaginary insulating boundary 49. The purpose for these definitions will become clear in the following.

Electrically conductive sheet 23 includes an electrically conductive polymer. Typically, electrically conductive polymers exhibit bulk resistivity values of less than 1000 ohm-cm. Resistivities less than 1000 ohm-cm can be readily achieved by compounding well-known conductive fillers into a polymer matrix binder.

Figure 8:
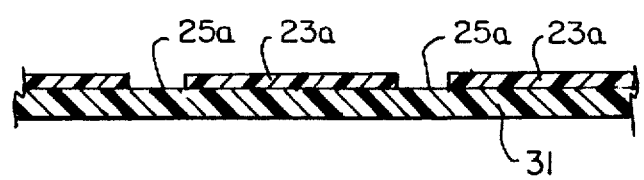
FIG. 8 is a sectional view similar to FIG. 7 showing an alternate embodiment of a substrate structure for achieving series interconnections of thin film photovoltaic cells.

The substrate unit 22 may be fabricated in a number of different ways. Electrically conductive sheet 23 can comprise an extruded film of electrically conductive polymer joined to a strip of compatible insulating polymer 25 at or near terminal edge 29 as illustrated in FIG. 7. Alternatively, the conductive sheet may comprise a strip of electrically conductive polymer 23a laminated to an insulating support structure 31 as illustrated in section in FIG. 8. In FIG. 8, electrically insulating joining portions 25a are simply those portions of insulating support structure 31 not overlaid by sheets 23a.

It is contemplated that electrically conductive sheets 23 may comprise materials in addition to the electrically conductive polymer. For example, a metal may be electrodeposited onto the electrically conductive polymer for increased conductivity. In this regard, the use of a directly electroplateable resin (DER) may be particularly advantageous.

Figure 9:
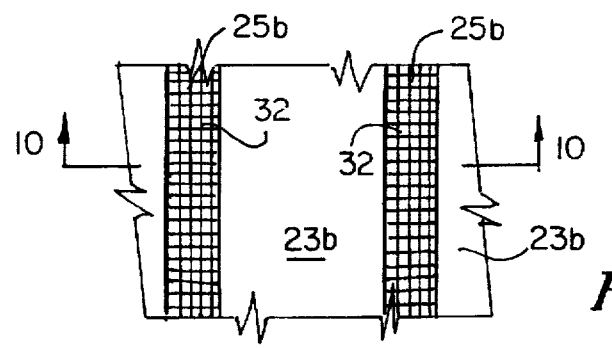
FIG. 9 is a top plan view of an alternate embodiment of a substrate structure for achieving series interconnections of thin film photovoltaic cells.
Figure 10:
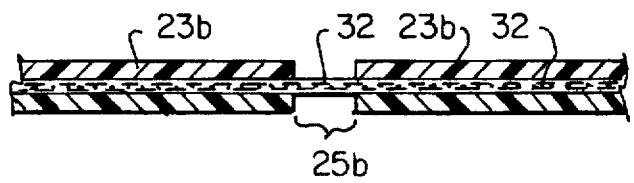
FIG. 10 is a sectional view similar to FIGS. 7 and 8 taken substantially along line 10—10 of FIG. 9.

A further embodiment of fabrication of substrate unit 22 is illustrated in FIGS. 9 and 10. In FIG. 9, electrically conductive sheet 23b comprises electrically conductive polymer impregnated into a fabric or web 32. A number of known techniques can be used to achieve such impregnation. Insulating joining portion 25b in FIG. 9 is simply an un-impregnated extension of the web 32. Fabric or web 32 can be selected from a number of woven or non-woven fabrics, including non-polymeric materials such as fiberglass.

Figure 11:
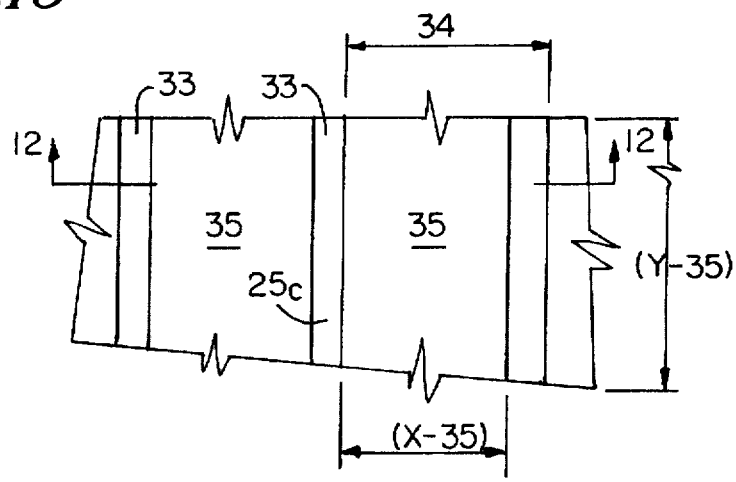
FIG. 11 is a top plan view of another embodiment of a substrate structure for achieving series interconnections of thin film photovoltaic cells.

Referring now to FIG. 11, an alternate embodiment for the substrate structures of the present invention is illustrated. In the FIG. 11, a support web or film 33 extends among and supports multiple individual cell units, generally designated by repeat structure 34. Electrically conductive sheets 35 are analogous to sheet 23 of FIGS. 6 through 10. At the stage of overall manufacture illustrated in FIG. 11, electrically conductive sheets 35 need not comprise an electrically conductive polymer as do sheets 23 of FIGS. 6 through 10. However, as will be shown, electrically conducting means, typically in the form of an electrically conductive polymer containing adhesive, must eventually be utilized to join photovoltaic laminate 10 to the top surface 50 of electrically conductive sheets 35. In addition, the electrically conducting sheets 35 must be attached to the support carrier 33 with integrity required to maintain positioning and dimensional control. This is normally accomplished with an adhesive, indicated by layer 36 of FIG. 12.

Figure 12:
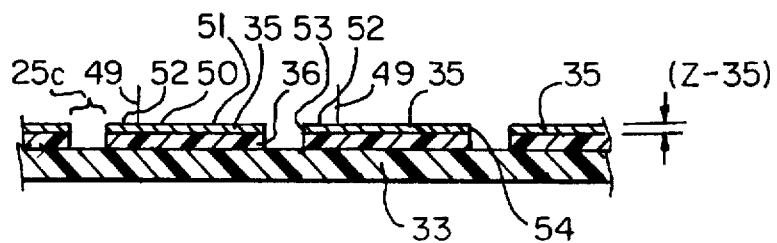
FIG. 12 is a sectional view taken substantially along the line 12—12 of FIG. 11.

Conductive sheets 35 are shown in FIGS. 11 and 12 as having length Y-35, width X-35 and thickness Z-35. It is contemplated that length Y-35 is considerably greater than width X-35 and length Y-35 can generally be described as "continuous" or being able to be processed in roll-to-roll fashion. Width X-35 defines a first terminal edge 53 and second terminal edge 54 of sheet 35.

It is important to note that the thickness of the conductive sheets 35, Z-35 must be sufficient to allow for continuous lamination to the support web 33. Typically when using metal based foils for sheets 35, thickness between 0.001 cm and 0.025 cm would be chosen.

As with the substrate structures of FIGS. 6 through 10, is helpful to characterize top surface 50 of conductive sheets 35 as having a top collector surface 51 and a top contact surface 52 separated by an imaginary insulating barrier 49.

Figure 13A:
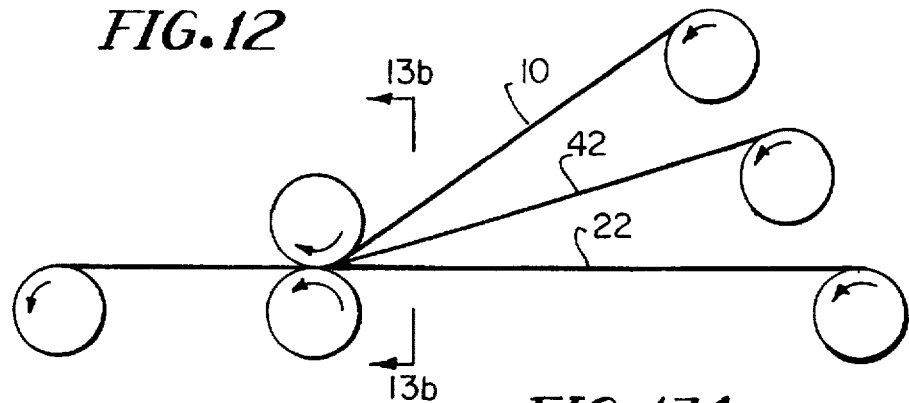
FIGS. 13a and 13b schematically depict a process for laminating the foil supported thin film photovoltaic structure of FIGS. 1 through 3 to an interconnecting substrate structure.
Figure 13B:
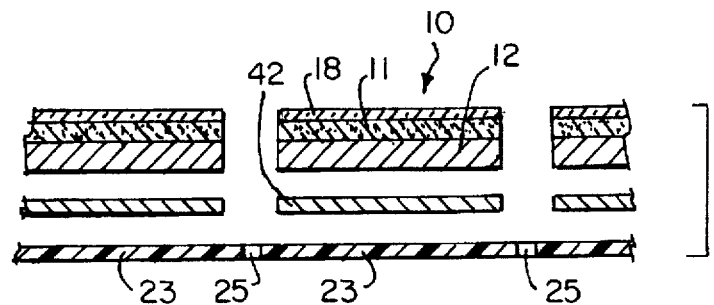

Referring now to FIGS. 13a and 13b, a process is shown for laminating the metal-based foil supported thin film photovoltaic structure of FIGS. 1 through 3 to the substrate structures taught in FIGS. 6 through 12. In FIGS. 13a and 13b, photovoltaic cell structures as illustrated in FIGS. 1 through 3 are indicated by numeral 10. Substrate structures as taught in the FIGS. 6 through 12 are indicated by the numeral 22. Numeral 42 indicates a film of electrically conductive adhesive intended to join electrically conductive metal-based foil 12 of FIGS. 1 through 3 to electrically conductive sheet 23 of FIGS. 6 through 10 or electrically conductive sheets 35 of FIGS. 11 and 12. It will be appreciated by those skilled in the art that the adhesive strip 42 shown in FIGS. 13a and 13b is one of but a number of appropriate metal joining techniques which would maintain required ohmic communication. For example, it is contemplated that methods such as doctor blading a conductive resin prior to lamination, spot welding, soldering, joining with low melt temperature alloys, or crimped mechanical contacts would serve as equivalent methods to accomplish the ohmic joining illustrated as achieved in FIGS. 13a and 13b with a strip of conductive adhesive. These equivalent methods can be generically referred to as conductive joining means.

Figure 14A:
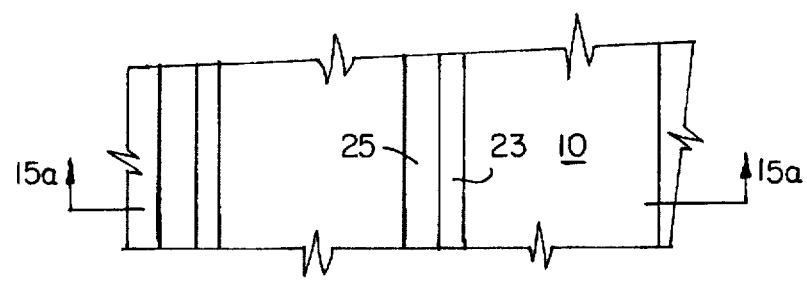
FIGS. 14a, 14b, and 14c are views of the structures resulting from the laminating process of FIGS. 13 and using the substrate structure of FIGS. 7, 8 and 10, respectively.
Figure 14B:
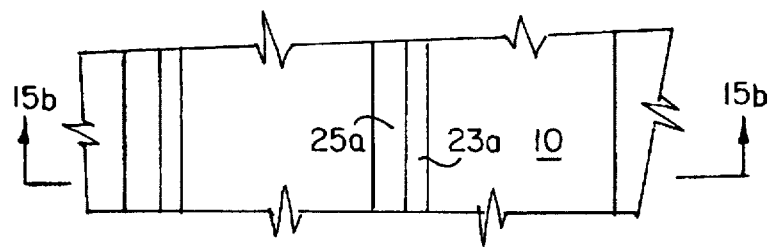
Figure 14C:
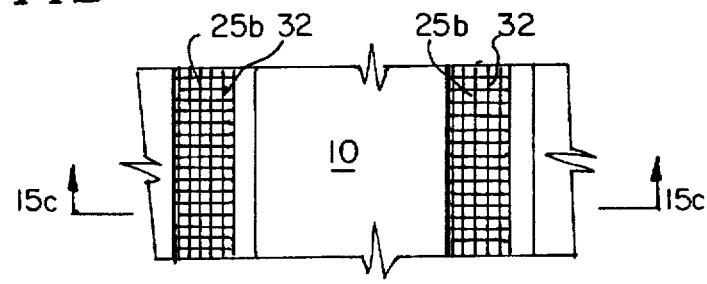
Figure 15A:
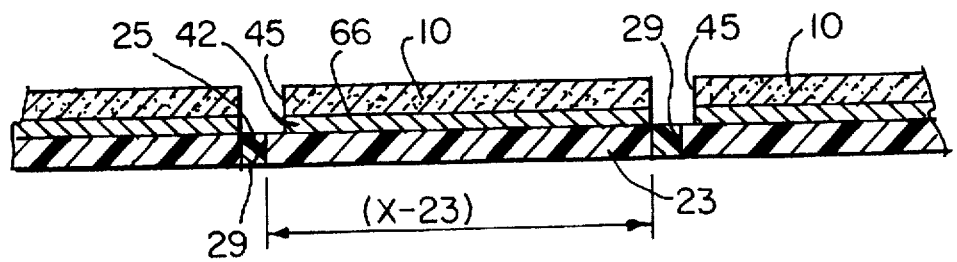
FIGS. 15a, 15b, and 15c are sectional views taken substantially along the lines 15a—15a, 15b—15b, and 15c—15c of FIGS. 14a, 14b, and 14c, respectively.
Figure 15B:
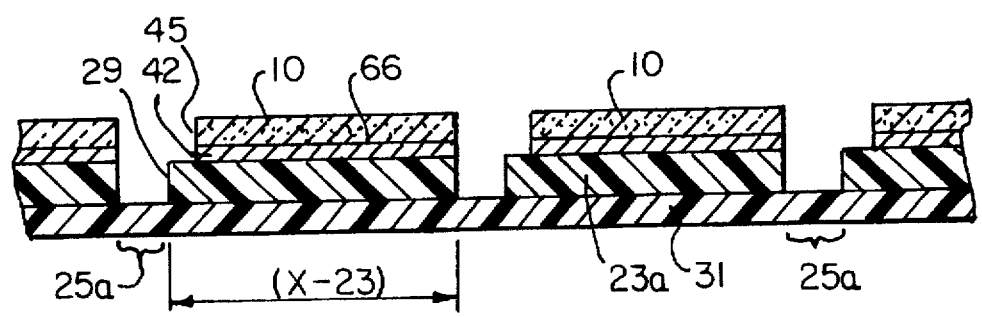
Figure 15C:
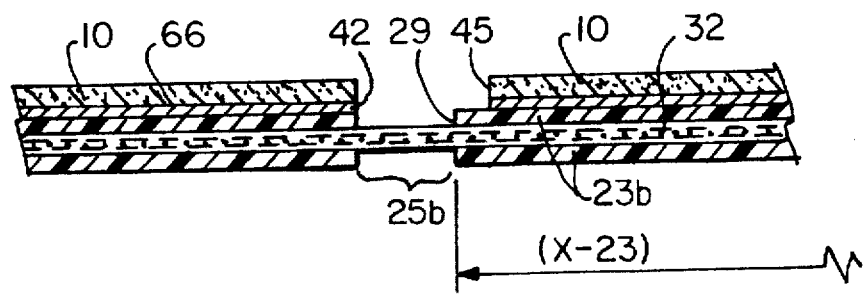
Figure 22:
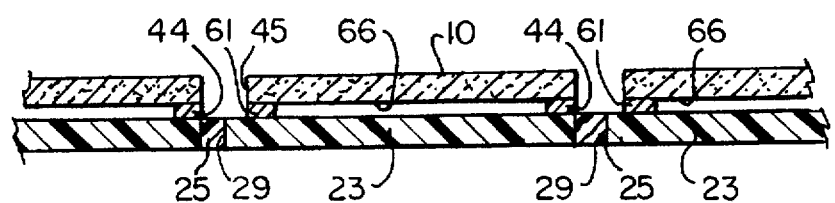
FIG. 22 is a sectional view similar to FIG. 15a but showing an alternate method of accomplishing the mechanical and electrical joining of the lamination process of FIG. 13.

Referring now to FIGS. 14 and 15, there is shown the result of the lamination process of FIG. 13 using the substrate structure of FIGS. 6 through 10. FIGS 14a and 15a correspond to the substrate structures of FIGS. 6 and 7. FIGS. 14b and 15b correspond to the substrate structure of FIG. 8. FIGS. 14c and 15c correspond to the substrate structures of FIGS. 9 and 10. In the FIGS. 15a, 15b, and 15c, electrically conductive adhesive layer 42 is shown as extending completely and contacting the entirety of the second surface 66 of metal-based foil supported photovoltaic cells 10. This complete surface coverage is not a requirement however, in that foil 12 is highly conductive and able to distribute current over the expansive width X-10 with minimal resistance losses. For example, the structure of FIG. 22 shows an embodiment wherein electrical communication is achieved between conductive sheet 23 of FIGS. 6 and 7 and second surface 66 of foil 12 through a narrow bead of conductive joining means 61. An additional bead of adhesive shown in FIG. 22 by 44, may be used to ensure spacial positioning and dimensional support for this form of structure. Adhesive 44 need not be electrically conductive.

Figure 23:
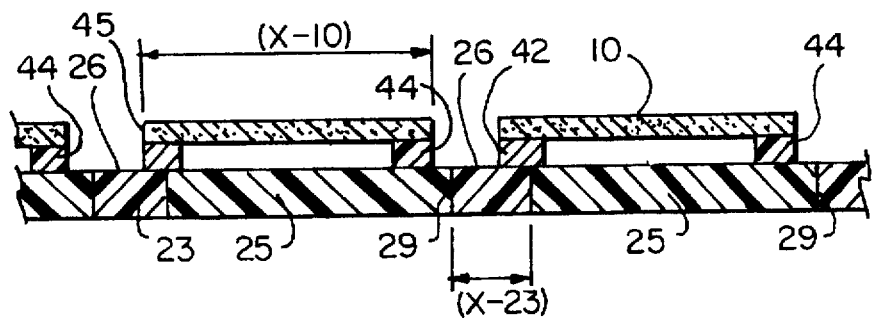
FIG. 23 is a sectional view similar to FIG. 15a but showing an alternate embodiment of the laminated structure.

In the FIGS. 15a, 15b, and 15c, the conductive sheets 23, 23a, and 23b are shown to be slightly greater in width X-23 than the width of foil X-10. As is shown in FIG. 23, this is not a requirement for satisfactory completion of the series connected arrays. FIG. 23 is a sectional view of a form of the substrate structures of FIGS. 6 and 7 laminated by the process of FIG. 13 to the photovoltaic structures of FIGS. 1–3. In FIG. 23, width X-10 is greater than width X-23. Electrical communication is achieved through conductive joining means 42 and additional joining means 44 to achieve dimensional stability may be employed. The only requirement of the current invention is that first conductive sheet terminal edge 29 be offset from first photovoltaic cell terminal edge 45 to expose a portion of top surface 26 of conductive sheet 23.

Figure 16:
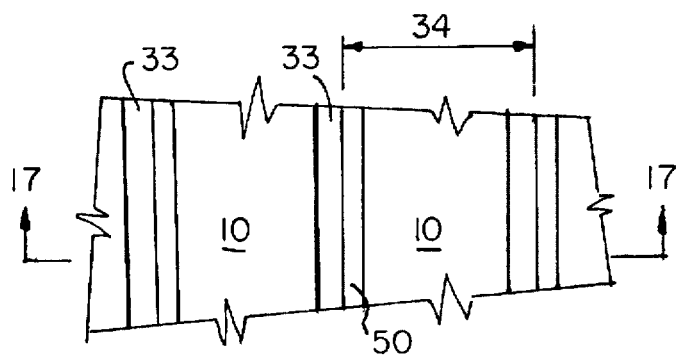
FIG. 16 is a top plan view of the structure resulting from the laminating process of FIG. 13 and using the substrate structure of FIGS. 11 and 12.
Figure 17:
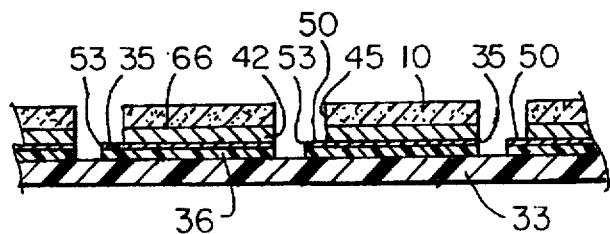
FIG. 17 is a sectional view taken substantially along the line 17—17 of FIG. 16.

Referring now to FIGS. 16 and 17, there is shown an alternate structure resulting from the laminating process of FIG. 13 as applied to the photovoltaic cells of FIGS. 1–3 and the substrate structure of FIGS. 11 and 12. In a fashion similar to that of FIGS. 15, 22, and 23, the first terminal edges 53 of conductive sheets 35 supported by insulating substrate 33 are slightly offset from the first terminal edge 45 of photovoltaic cells 10. This offset exposes a portion of top surface 50 of conductive sheet 35. Electrical and mechanical joining of sheets 35 with second surface 66 of metal-based foil 12 is shown in FIG. 17 as being achieved with conductive adhesive 42 as in previous embodiments. However, it is contemplated as in previous embodiments that this electrical and mechanical joining can be accomplished by alternate means such as soldering, joining with compatible low melting point alloys, spot welding, or mechanical crimping.

Comparing the sectional views of FIGS. 15, 22, 23, and 17, one observes many similarities. The most important common structural similarity is that the first terminal edges 29 of conductive sheets 23 be offset slightly from first terminal edge 45 of photovoltaic cells 10 (FIGS. 15, 22, 23). Similarly, first terminal edges 53 of conductive sheets 35 are slightly offset from first terminal edges 45 of photovoltaic cells 10 (FIG. 17). As will be shown, the resulting exposed top surface portions are used as contact surfaces for the final interconnected array.

Figure 24:
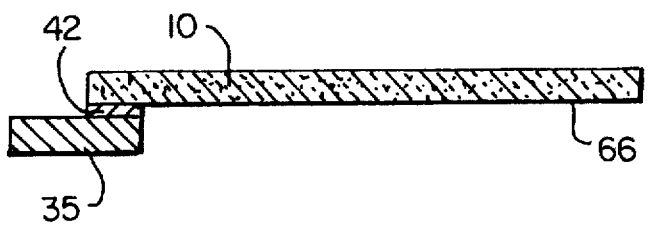
FIG. 24 is a sectional view of an alternate embodiment.
Figure 25:
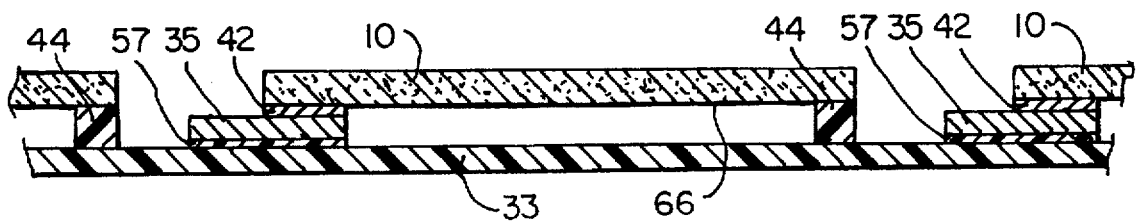
FIG. 25 is a sectional view of the embodiment of FIG. 24 after a further processing step.

It should also be observed that the structures equivalent to those shown in FIGS. 16 and 17 can also be achieved by first joining photovoltaic cells 10 and conductive sheets 35 with suitable electrically conductive joining means 42 to give the structure shown in FIG. 24 and laminating these strips to an insulating support web 33. An example of such an equivalent structure is shown in FIG. 25, wherein the laminates of FIG. 24 have been adhered to insulating web 33 in defined repeat positions with adhesive means 57. As mentioned above and as shown in FIGS. 24 and 25, conductive sheets 35 do not have to contact the whole of the bottom surface 66 of photovoltaic cell 10.

Figure 18:
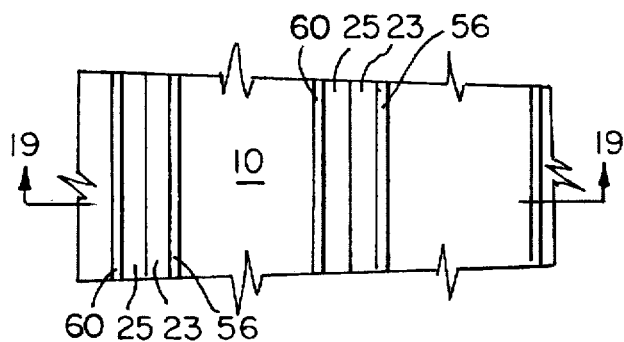
FIG. 18 is a top plan view of the structures of FIGS. 14a and 15a but following an additional step in manufacture of the interconnected cells.
Figure 19:
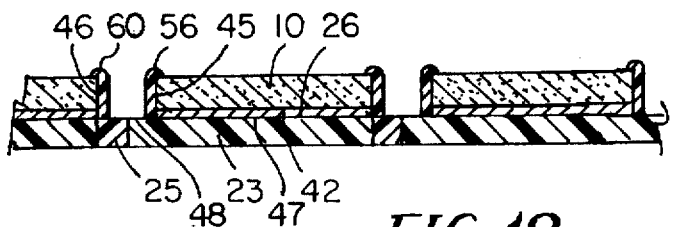
FIG. 19 is a sectional view taken substantially along the line 19—19 of FIG. 18.

Referring now to FIGS. 18 and 19, beads 56 and 60 of insulating material having been applied to the first and second terminal edges 45 and 46 respectively of photovoltaic cells 10. While these beads 56 and 60 are shown as applied to the structure of FIG. 15a, it is understood that appropriate beads of insulating material are also envisioned as a subsequent manufacturing step for the structures of 15b, 15c, 17, 22, 23 and 25. The purpose of the insulating beads is to protect the edge of the photovoltaic cells from environmental and electrical deterioration. In addition, as will be shown the insulating bead allows for electrical interconnections to be made among adjacent cells without electrical shorting.

It is noted that the application of insulating material 56 to first terminal edge 45 of photovoltaic cells 10 effectively divides the top surfaces 26 and 50 of conductive sheets 23 and 35 respectively into two regions. The first region (region 48 of surface 26 or region 52 of surface 50) can be considered as a contact region for series interconnects among adjacent cells. The second region (region 47 of surface 26 or region 51 of surface 50) can be considered as the contact region for interconnecting the substrate to the second surface 66 of photovoltaic cells 10.

Figure 20:
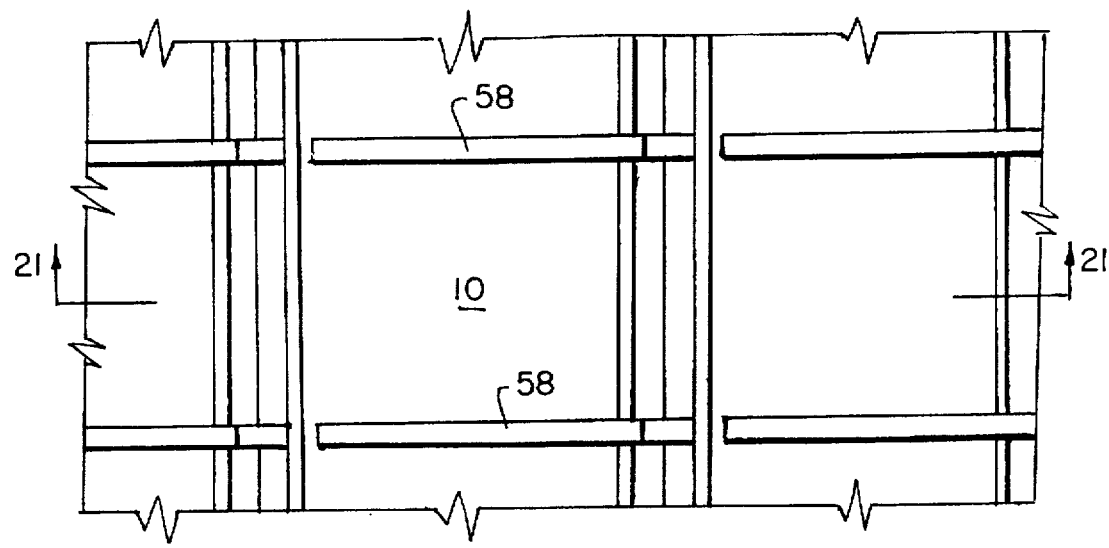
FIG. 20 is a top plan view of a completed interconnected array.
Figure 21:
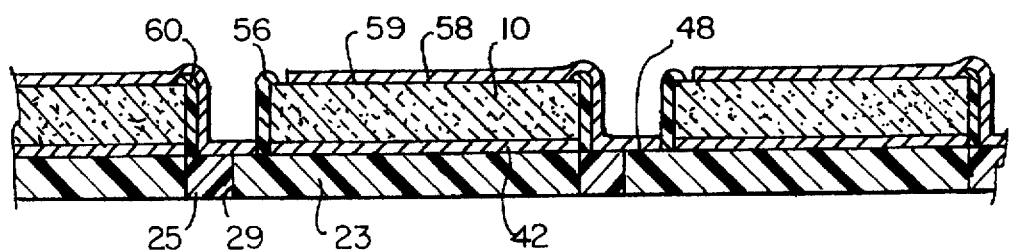
FIG. 21 is a sectional view taken substantially along line 21—21 of FIG. 20.

Referring now to FIGS. 20 and 21, there is shown the method of forming the final interconnected array. Grid fingers 58 of a highly electrically conductive material are deposited to achieve electrical communication between the top surface 59 of the photovoltaic cell 10 and the remaining exposed contact regions 48 or 52 of an adjacent cell. It is contemplated that these fingers can be deposited by any of a number of processes to deposit metal containing or metal-based foils or films, including masked vacuum deposition, printing of conductive inks, electrodeposition or combinations thereof.

Following deposition of the grid fingers, it would be normal to protect the integrated array with some form of encapsulant, but these latter processes do not form the subject matter of the present invention.

It is important to recognize that the unique design and process taught by the present invention is accomplished in a fully additive fashion. No wasteful and costly material removal steps are needed to achieve the integrated series connected arrays taught. This is a significant advantage over the prior art.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. An intermediate article in the manufacture of a series interconnected array of photovoltaic cells comprising one or more units, each of said units comprising:

a photovoltaic cell comprising thin films of semiconductor material forming a photovoltaic junction supported on a metal-based foil, said cell having a top cell surface and a bottom cell surface, said cell further having a cell length, a cell width, and a cell thickness, said cell width defining a first cell terminal edge and a second cell terminal edge, a separately prepared substrate structure comprising electrically conductive material and electrically non-conductive material, said electrically conductive substrate material having a top surface and a linear dimension whose endpoints define first and second terminal edges of said electrically conductive substrate material, said electrically conductive and non-conductive materials being joined together in a generally planar structure, said photovoltaic cell being joined to said substrate structure such that said first cell terminal edge is positioned between said first and second terminal edges of said electrically conductive substrate material so that a portion of said bottom cell surface overlays a first portion of said conductive substrate material top surface leaving a second portion of said conductive substrate material top surface exposed.

2. The article of claim 1 wherein said cell width is substantially constant throughout the entire length of said cell.

3. The article of claim 1 wherein said cell length is substantially greater than said cell width thereby allowing roll-to-roll processing.

4. The article of claim 1 wherein said bottom cell surface and said first portion of said conductive substrate material top surface are electrically connected by electrically conductive joining means.

5. The article of claim 4 wherein said electrically conductive joining means comprises an electrically conductive adhesive.

6. The article of claim 4 wherein said electrically conductive joining means comprises a metal-based solder.

7. The article of claim 3 wherein said electrically conductive joining means comprises a weld.

8. The article of claim 7 wherein said weld is a spot weld.

9. The article of claim 1 further comprising a first said unit and a second said unit, and means to establish electrical communication between said second exposed portion of said conductive substrate material top surface of said first unit and said top cell surface of said second unit.

10. The article of claim 9 wherein said means to establish electrical communication comprises an electrodeposited metal.

11. The article of claim 1 wherein said metal-based foil has a thickness, said foil thickness being between 0.001 cm. and 0.025 cm.

12. An intermediate article in the manufacture of a series interconnected array of photovoltaic cells comprising one or more units, each of said units comprising:

a substrate structure comprising an electrically conductive portion joined to an electrically non-conductive portion, said electrically conductive portion having top and bottom electrically conductive surfaces, a first photovoltaic cell comprising thin films of semiconductor material forming a photovoltaic junction supported on a metal-based foil, said foil being in electrical communication with said electrically conductive portion, a part of said substrate top electrically conductive surface being exposed, and a part of said substrate bottom electrically conductive surface being exposed.

13. An intermediate article in the manufacture of a series interconnected array of photovoltaic cells comprising one or more units, each of said units comprising:

a photovoltaic cell comprising thin films of semiconductor forming a photovoltaic junction supported on a first metal-based foil having a first metal-based foil thickness, said cell having a top cell surface and a bottom cell surface, said cell further having a cell length, a cell width and a cell thickness, said cell width defining a first cell terminal edge and a second cell terminal edge, an originally separate second metal-based foil characterized by the absence of semiconductor materials, said second metal-based foil having a length co-linear with said cell length, a width co-linear with said cell width, and a thickness, said second metal-based foil width defining first and second terminal edges of said second metal-based foil, said second metal-based foil further having top and bottom surfaces, said photovoltaic cell being positioned relative to said second metal-based foil such that said first cell terminal edge is positioned between said first and second terminal edges of said second metal-based foil so that a portion of said bottom cell surface overlays a first portion of said second metal-based foil top surface leaving a second portion of said second metal-based foil top surface exposed, said bottom cell surface and said second metal-based foil being in electrical communication through electrically conductive joining means.

14. An article as in claim 13 wherein said second metal-based foil comprises an electrodeposit.

15. An article as in claim 13 wherein said first metal-based foil thickness is between 0.001 cm. and 0.025 cm.

16. A method of manufacture of a series interconnected array of photovoltaic cells, comprising:

manufacture of photovoltaic cells using roll-to-roll processing, said cells comprising thin films of semiconductor material supported on a metal-based foil, said cells having a top cell surface and a bottom cell surface, a cell width, a cell length and a cell thickness, said cell length being considerably greater than said cell width, said cell width defining first and second terminal edges of said cells, supplying a separately prepared substrate comprising electrically conductive material regions, said regions having a top surface and a bottom surface, joining said bottom cell surface of a first of said cells to said top surface of a first of said electrically conductive regions leaving exposed a portion of said top surface of said first of said electrically conductive regions, said joining being accomplished vicinal said first cell terminal edge, said joining employing electrically conductive joining means to establish electrical communication between said bottom cell surface of a first of said cells and said top surface of a first of said electrically conductive regions.

* * * * *